(12) United States Patent
Yan et al.

(10) Patent No.: US 11,257,977 B2
(45) Date of Patent: Feb. 22, 2022

(54) DIFFUSION BASED EX-SITU GROUP V (P, AS, SB, BI) DOPING IN POLYCRYSTALLINE CDTE THIN FILM SOLAR CELLS

(71) Applicants: THE BOARD OF TRUSTEES OF THE UNIVERSITY OF ALABAMA, Tuscaloosa, AL (US); The University of Toledo, Toledo, OH (US)

(72) Inventors: Feng Yan, Tuscaloosa, AL (US); Yanfa Yan, Toledo, OH (US)

(73) Assignees: THE BOARD OF TRUSTEES OF THE UNIVERSITY OF ALABAMA, Tuscaloosa, AL (US); The University of Toledo, Toledo, OH (US)

( * ) Notice: Subject to any disclaimer, the term of this patent is extended or adjusted under 35 U.S.C. 154(b) by 0 days.

(21) Appl. No.: 17/190,664

(22) Filed: Mar. 3, 2021

(65) Prior Publication Data

US 2021/0280735 A1      Sep. 9, 2021

Related U.S. Application Data

(60) Provisional application No. 62/984,583, filed on Mar. 3, 2020.

(51) Int. Cl.
    *H01L 31/18*   (2006.01)
    *H01L 31/073*  (2012.01)
(52) U.S. Cl.
    CPC ...... *H01L 31/1828* (2013.01); *H01L 31/1864* (2013.01); *H01L 31/073* (2013.01)

(58) Field of Classification Search
    CPC .......... H01L 31/01836; H01L 31/1828; H01L 31/1864; H01L 31/073; H01L 31/022425;
    (Continued)

(56) References Cited

U.S. PATENT DOCUMENTS 6,251,701 B1 * 6/2001 McCandless ....... H01L 31/1828
                                                           438/95
9,318,642 B2 * 4/2016 Gupta ................... H01L 31/073
(Continued)

OTHER PUBLICATIONS

Barrioz et al., A comparison of in situ As doping with ex situ CdCl2 treatment of CdTe solar cells, Materials Research Society Symposium Proceedings, 865, F3.4, 10,1557/PROC-865-F3.4 (Year: 2011).*
(Continued)

*Primary Examiner* — Earl N Taylor
(74) *Attorney, Agent, or Firm* — Meunier Carlin & Curfman LLC

(57) ABSTRACT

Described herein is a diffusion-based ex-situ group V element doping method in the $CdCl_2$ heat-treated polycrystalline CdTe film. The ex-situ doping using group V halides, such as $PCl_3$, $AsCl_3$, $SbCl_3$, or $BiCl_3$, demonstrated a promising PCE of ~18% and long-term light soaking stability in CdSe/CdTe and CdS/CdTe devices with decent carrier concentration $>10^{15}$ $cm^{-3}$. This ex-situ solution or vapor process can provide a low-cost alternative pathway for effective doping of As, as well as P, Sb, and Bi, in CdTe solar cells with limited deviation from the current CdTe manufacturing process.

18 Claims, 6 Drawing Sheets

(58) Field of Classification Search
CPC ... H01L 31/02963; Y02E 10/543; Y02P 70/50
See application file for complete search history.

(56) References Cited

U.S. PATENT DOCUMENTS

| | | | | |
|---|---|---|---|---|
| 11,189,748 | B2* | 11/2021 | Heben | H01L 31/073 |
| 2013/0312824 | A1* | 11/2013 | Christensen | H01L 31/022441 136/256 |
| 2014/0065762 | A1* | 3/2014 | Clark | H01L 31/073 438/95 |
| 2017/0352775 | A1* | 12/2017 | Hahn | H01L 31/1836 |
| 2018/0219166 | A1* | 8/2018 | Ellingson | H01L 51/424 |
| 2021/0043794 | A1* | 2/2021 | Brubaker | H01L 21/02562 |
| 2021/0143288 | A1* | 5/2021 | Grover | H01L 31/1828 |
| 2021/0280735 | A1* | 9/2021 | Yan | H01L 31/02963 |

OTHER PUBLICATIONS

Abken, A. E. and Bartlet, O. J. "Sputtered Mo/Sb2Te3 and Ni/Sb2Te3 layers as back contacts for CdTe/CdS solar cells." Thin Solid Films 403-404 (2002): 216-222.

Ablekim, Tursun, Eric Colegrove, and Wyatt K. Metzger. "Interface engineering for 25% CdTe solar cells." ACS Applied Energy Materials 1.10 (2018): 5135-5139.

Ablekim, Tursun, et al. "Self-compensation in arsenic doping of CdTe." Scientific reports 7.1 (2017), 4563.

Artegiani, Elisa, et al. "Analysis of a novel CuCl2 back contact process for improved stability in CdTe solar cells." Progress in Photovoltaics: Research and Applications 27.8 (2019): 706-715.

Barrioz, Vincent, et al. "Highly arsenic doped CdTe layers for the back contacts of CdTe solar cells." MRS Online Proceedings Library 1012.1 (2007): 1-6.

Becker, Jacob J., et al. "Loss analysis of monocrystalline CdTe solar cells with 20% active-area efficiency." IEEE journal of photovoltaics 7.3 (2017): 900-905.

Bhattacharya, R. N., and K. Rajeshwar. "Heterojunction CdS/CdTe solar cells based on electrodeposited p-CdTe thin films: Fabrication and characterization." Journal of applied physics 58.9 (1985): 3590-3593.

Brooks, W. S. M., S. J. C. Irvine, and D. M. Taylor. "Scanning Kelvin probe measurements on As-doped CdTe solar cells." Semiconductor science and technology 28.10 (2013): 105024.

Burst, J.M., et al., "CdTe solar cells with open-circuit voltage breaking the 1 V barrier", Nature Energy vol. 1, Article No. 16015 (2016).

Burst, James M., et al. "Carrier density and lifetime for different dopants in single-crystal and polycrystalline CdTe." APL Materials 4.11 (2016): 116102.

Burton, G. L., et al. "Understanding arsenic incorporation in CdTe with atom probe tomography." Solar Energy Materials and Solar Cells 182 (2018): 68-75.

Chilyasov, A. V., et al. "Growth of arsenic-doped cadmium telluride epilayers by metalorganic chemical vapor deposition." Inorganic Materials 52.12 (2016): 1210-1214.

Colegrove, Eric, et al. "Antimony diffusion in CdTe." IEEE Journal of Photovoltaics 7.3 (2017): 870-873.

Colegrove, Eric, et al. "Phosphorous Diffusion Mechanisms and Deep Incorporation in Poly crystalline and Single-Crystalline CdTe." Phys Rev Appl 5, 054014 (2016).

Danielson, Adam, et al. "MOCVD Deposition of Group V Doped CdTe in Sublimated CdTe and CdSeTe Devices." 2018 IEEE 7th World Conference on Photovoltaic Energy Conversion (WCPEC)(A Joint Conference of 45th IEEE PVSC, 28th PVSEC & 34th EU PVSEC). IEEE, 2018.

Duan, H., et al. "Sources of carrier compensation in arsenic-doped HgCdTe." Journal of Physics and Chemistry of Solids 74.1 (2013): 57-64.

Farrell, Stuart, et al. "In situ arsenic doping of CdTe/Si by molecular beam epitaxy." Journal of Electronic Materials 44.9 (2015): 3202-3206.

Fiducia, Thomas AM, et al. "Understanding the role of selenium in defect passivation for highly efficient selenium-alloyed cadmium telluride solar cells." Nature Energy 4.6 (2019): 504-511.

Flores, Mauricio A., Walter Orellana, and Eduardo Menéndez-Proupin. "Self-compensation in phosphorus-doped CdTe." Physical Review B 96.13 (2017): 134115.

Grecu, D., et al. "Photoluminescence of Cu-doped CdTe and related stability issues in CdS/CdTe solar cells." Journal of Applied Physics 88.5 (2000): 2490-2496.

Green, Martin A., et al. "Solar cell efficiency tables." Progress in photovoltaics: research and applications 2019, 27, 565-575.

Gretener, C., et al. "New perspective on the performance stability of CdTe solar cells." Solar Energy Materials and Solar Cells 146 (2016): 51-57.

Grover, Sachit, et al. "Characterization of arsenic doped CdTe layers and solar cells." 2017 IEEE 44th Photovoltaic Specialist Conference (PVSC). IEEE, 2017, 1193-1195.

Guo, D., et al., "Metastability and reliability of CdTe solar cells ", J Physics D: Appl Phys, 2018, 51, 153002.

Huang, Jian, et al. "Copassivation of polycrystalline CdTe absorber by CuCl thin films for CdTe solar cells." Applied Surface Science 484 (2019): 1214-1222.

Kartopu, G., et al. "Study of thin film poly-crystalline CdTe solar cells presenting high acceptor concentrations achieved by in-situ arsenic doping." Solar Energy Materials and Solar Cells 194 (2019): 259-267.

Khan, Imran Suhrid, "In Situ Extrinsic Doping of CdTe Thin Films for Photovoltaic Applications." Graduate Theses and Dissertations, 2018, 109 pages.

Krasikov, Dmitry, and Igor Sankin. "Defect interactions and the role of complexes in the CdTe solar cell absorber." Journal of Materials Chemistry A 5.7 (2017): 3503-3513.

Kuciauskas, Darius, et al. "The impact of Cu on recombination in high voltage CdTe solar cells." Applied Physics Letters 107.24 (2015): 243906.

Li, Chen, et al. "Grain-boundary-enhanced carrier collection in CdTe solar cells." Physical review letters 112.15 (2014): 156103.

Liang, Tian, et al. "Anomalous Nernst effect in the dirac semimetal Cd 3 As 2." Physical review letters 118.13 (2017): 136601.

Major, Jonathan D. "Grain boundaries in CdTe thin film solar cells: a review." Semiconductor Science and Technology 31.9 (2016): 093001.

Mao, Dan, C. E. Wickersham, and Markus Gloeckler. "Measurement of chlorine concentrations at CdTe grain boundaries." IEEE Journal of Photovoltaics 4.6 (2014): 1655-1658.

McCandless, Brian E., et al. "Overcoming carrier concentration limits in polycrystalline CdTe thin films with in situ doping." Scientific reports 8.1 (2018), Article No. 14519, pp. 1-13.

McCandless, Brian, et al. "Enhanced p-type doping in polycrystalline CdTe films: deposition and activation." IEEE Journal of Photovoltaics 9.3 (2019): 912-917.

Metzger, Wyatt K., et al. "Exceeding 20% efficiency with in situ group V doping in polycrystalline CdTe solar cells." Nature Energy 4.10 (2019): 837-845.

Montgomery, Angelique, et al. "Solution-processed copper (I) thiocyanate (CuSCN) for highly efficient CdSe/CdTe thin-film solar cells." Progress in Photovoltaics Research and Applications 27.8 (2019): 665-672.

Munshi, Amit H., et al. "Effect of CdCl2 passivation treatment on microstructure and performance of CdSeTe/CdTe thin-film photovoltaic devices." Solar Energy Materials and Solar Cells 186 (2018): 259-265.

Nagaoka, Akira, Darius Kuciauskas, and Michael A. Scarpulla. "Doping properties of cadmium-rich arsenic-doped CdTe single crystals: Evidence of metastable AX behavior." Applied Physics Letters 111.23 (2017): 232103.

Nagaoka, Akira, et al. "Arsenic doped Cd-rich CdTe: equilibrium doping limit and long lifetime for high open-circuit voltage solar cells greater than 900 mV." Applied Physics Express 12.8 (2019): 081002.

(56) References Cited

OTHER PUBLICATIONS

Nagaoka, Akira, et al. "High p-type doping, mobility, and photocarrier lifetime in arsenic-doped CdTe single crystals." Applied Physics Letters 112.19 (2018): 192101.
Nair, Jaya P., et al. "In situ Sb-doped CdTe films." Semiconductor science and technology 13.3 (1998): 340-344.
Nardone, Marco, and David S. Albin. "Degradation of CdTe solar cells: simulation and experiment." IEEE Journal of Photovoltaics 5.3 (2015): 962-967.
Ochai Oklobia, and Stuart J. C. Irvine, "Properties of Arsenic-Doped ZnTe Thin Films as a Back Contact for CdTe Solar Cells", PVSAT-15 Proceeding, 2019, 3706.
Park, J. H., et al. "Incorporation and activation of arsenic dopant in single-crystal CdTe grown on Si by molecular beam epitaxy." Journal of electronic materials 43.8 (2014): 2998-3003.
Paudel, et al., "Study of Close Space Sublimation (CSS) Grown SnS Thin-films for Solar Cell Applications", 2015 IEEE 42nd Photovoltaic Specialist Conference (PVSC), 2015, pp. 1-3.
Paul, Sanjoy, et al. "Buffer/absorber interface recombination reduction and improvement of back-contact barrier height in CdTe solar cells." Thin Solid Films 685 (2019): 385-392.
Perkins, Craig L., et al. "SnO2-Catalyzed Oxidation in High-Efficiency CdTe Solar Cells." ACS applied materials & interfaces 11.13 (2019): 13003-13010.
Polman, A., Knight, M., Garnett, E. C., Ehrler, B., & Sinke, W. C. (2016). Photovoltaic materials: Present efficiencies and future challenges. Science, 352(6283).
Poplawsky, Jonathan D., et al. "Direct imaging of Cl-and Cu-induced short-circuit efficiency changes in CdTe solar cells." Advanced Energy Materials 4.15 (2014): 1400454.
Poplawsky, Jonathan D., et al. "Structural and compositional dependence of the CdTe x Se 1—x alloy layer photoactivity in CdTe-based solar cells." Nature communications 7.1 (2016), 12537: 1-10.
Proskuryakov, Y. Y., et al. "Doping levels, trap density of states and the performance of co-doped CdTe (As, Cl) photovoltaic devices." Solar Energy Materials and Solar Cells 93.9 (2009): 1572-1581.
Romeo, Nicola, Alessio Bosio, and Greta Rosa. "The back contact in CdTe/CdS thin film solar cells." Proceedings ISES Solar World Congress 2017. 2017.
Yang, Ji-Hui, et al. "First-principles study of roles of Cu and Cl in polycrystalline CdTe." Journal of Applied Physics 119.4 (2016): 045104.
Zhang, Lixin, et al. "Effect of copassivation of Cl and Cu on CdTe grain boundaries." Physical review letters 101.15 (2008): 155501.
Zhao, yuan, et al., "Monocrystalline CdTe solar cells with open-circuit voltage over 1 V and efficiency of 17%", Nature Energy, vol. 1, Issue 6, pp. 16067 (2016). 10.1038/nenergy.2016.67.

* cited by examiner

DIFFUSION BASED EX-SITU GROUP V (P, AS, SB, BI) DOPING IN POLYCRYSTALLINE CDTE THIN FILM SOLAR CELLS

CROSS-REFERENCE TO RELATED APPLICATIONS

This application claims the benefit of U.S. Provisional Application No. 62/984,583, filed Mar. 3, 2020, the content of which is incorporated herein by reference in its entirety.

BACKGROUND

Polycrystalline cadmium telluride (CdTe) photovoltaic (PV) devices are one of the most successful commercial thin film solar cell technologies with record power conversion efficiency (PCE)>22% (M. A. Green et al., *Progress in Photovoltaics: Research and Applications*, 2019, 27, 565-575; A. Polman et al., *Science*, 2016, 352, aad4424). Making a high PCE CdTe device demands extrinsic doping to achieve a high carrier concentration and long carrier lifetime, which would lead to a high open-circuit voltage ($V_{oc}$) and short-circuit current ($J_{sc}$). For example, Cu (Group 1) doping in polycrystalline CdTe solar cells lead to a record $V_{oc}$~880 mV with a champion efficiency of 22.1% (J. M. Burst et al., *Nature Energy*, 2016, 1, 16015; Y. Zhao et al., *Nature Energy*, 2016, 1, 16067). However, the superior performance of polycrystalline CdTe compared to that of the monocrystalline CdTe could benefit from the Cl and dopant passivated grain boundaries to enhance the photogenerated carrier transport and collection (J. J. Becker et al., *IEEE J Photovoltaics*, 2017, 7, 900-905; C. Li et al., *Phys Rev Lett*, 2014, 112, 156103; L. Zhang et al., *Phys Rev Lett*, 2008, 101, 155501; J. D. Major, *Semiconductor Sci Technol*, 2016, 31, 093001). The excellent polycrystalline CdTe device performance is at the expense of photovoltage loss, which significantly obstructs the CdTe devices to overcome the 25% goal with a Voc>1V to further boost the solar energy application (T. Ablekim et al., *ACS Appl Energy Mater*, 2018, 1, 5135-5139; B. E. McCandless et al., *Sci Rep*, 2018, 8, 14519-14519). In addition, the most popular Cu doping in polycrystalline CdTe causes reliability issues due to the rapid migration of Cu and its complicated defect interactions (D. Guo, et al., *J Physics D: Appl Phys*, 2018, 51; D. Grecu et al., *J Appl Phys*, 2000, 88, 2490-2496; D. Kuciauskas et al., *Appl Phys Lett*, 2015, 107, 243906; D. Krasikov and I. Sankin, *J Mater Chem A*, 2017, 5, 3503-3513; J.-H. Yang et al., *J Appl Phys*, 2016, 119, 045104). For instance, the Cu can stay at Cd sites to act as shallow acceptors ($Cu_{Cd}$) and increase the hole concentration (D. Kuciauskas et al., *Appl Phys Lett*, 2015, 107, 243906). However, Cu may enter interstitial sites and become a donor (i.e., hole killer) to reduce the p-type conduction of CdTe. Meanwhile, $Cu_{Ca}$ can interact with the Cl interstitials ($Cl_i$) and Cl substitution on Te sites ($Cl_{Te}$) to form $Cu_{Cd}$—$Cl_i$ and $Cu_{Cd}$—$Cl_{Te}$ complexes (D. Krasikov and I. Sankin, *J Mater Chem A*, 2017, 5, 3503-3513). These undesired Cu interstitials and Cu related defect complexes could also limit the polycrystalline CdTe device performance improvement to PCE>25%. Moreover, the fast migration of Cu and Cu related defects could also lead to significant degradation of the Cu doped CdTe solar panel within the 25-year warranty.

To address the low open-circuit voltage and poor reliability issues associated with Cu doping in the polycrystalline CdTe PV devices, group V elements doping (i.e., P, As, Sb and Bi elements) were extensively investigated because, these group V dopants possess larger radii than that of Cu ion, which can lead to a slow ion migration (i.e., slow degradation), and also expect to occupy Te sites to form shallow acceptors to increase the hole concentration (M. A. Flores, et al., *Phys Rev B*, 2017, 96; T. Ablekim, et al., *Sci Rep*, 2017, 7; A. Nagaoka, et al., *Appl Phys Lett*, 2017, 111, 232103; G. L. Burton, et al., *Sol Energ Mater Sol C*, 2018, 182, 68-75). For example, the promising results for the $V_{oc}$ above 1 V were demonstrated in the P doped monocrystalline CdTe device with an efficiency of 17%, As doped monocrystalline CdTe obtains a $V_{oc}$~901 mV (A. Nagaoka, et al., *Appl Phys Lett*, 2018, 112, 192101;) and Sb doped polycrystalline CdTe has achieved $V_{oc}$~760 mV (Khan, Imran Suhrid, *Graduate Theses and Disertations*, 2018). Most recently, it was successfully demonstrated that in-situ As doped polycrystalline CdTe using vapor transport deposition (VTD) achieved a $V_{oc}$ 856 mV and an efficiency>20% in CdSe/CdTe devices (W. K. Metzger et al., *Nature Energy*, 2019). Although these record efficiency and $V_{oc}$ values are slightly lower than that of Cu doped record CdTe cell (22.1%), it creates a pathway to achieve long-term reliability of CdTe solar modules.

Traditionally, in-situ extrinsic doping of group V elements was widely performed during the CdTe deposition, and it successfully achieved a high doping concentration and long carrier lifetime. For example, in-situ Sb, As, and P doping using CdSb, $Cd_3As_2$, and $Cd_3P_2$ as dopant sources during the VTD CdTe deposition (B. E. McCandless et al., *Sci Rep*, 2018, 8, 14519-14519). In-situ As doping of polycrystalline CdTe films have also been demonstrated by using metal-organic chemical vapor deposition (MOCVD) using [$(CH_3)_2N]_3As$ gas (G. Kartopu et al., *Sol Energy Mater Sol C*, 2019, 194, 259-267; A. Danielson et al., *MOCVD Deposition of Group V Doped CdTe in Sublimated CdTe and CdSeTe Devices*, 2018; A. V. Chilyasov et al., *Inorg Mater*, 2016, 52, 1210-1214), traveling heater method using As shot (A. Nagaoka, et al., *Appl Phys Lett*, 2018, 112, 192101) electrodeposition using $AsCl_3$ (J. P. Nair et al., *Semiconductor Sci Technol*, 1998, 13, 340-344; R. N. Bhattacharya and K. Rajeshwar, *J Appl Phys*, 1985, 58, 3590-3593), elemental vapor transport (EVT) using As gas (S. Farrell et al., *J. Electron. Mater*, 2015, 44, 3202-3206) and molecular beam epitaxy (MBE) using Asine ($AsH_3$) (G. Burton et al., Solar Eng. Mater. Solar Cells, 2016). However, the successful bulk in-situ group V element doping using VTD face various challenges. For example, the addition of group V dopants during the polycrystalline CdTe film deposition (at ~600° C. substrate temperature) or single crystal growth by the blend of CdTe with dopant sources still needs the following $CdCl_2$ treatment (at ~ 400° C.) to passivate grain boundaries and activate doping concentration (B. E. McCandless et al., *Sci Rep*, 2018, 8, 14519-14519; W. K. Metzger et al., *Nature Energy*, 2019). However, the high-temperature $CdCl_2$ treatment and activation process (~400° C.) will also limit the activation rate in the in-situ group V doping.

Moreover, the Group V doping process performed at the beginning of the CdTe module manufacturing could leave a significant As footprint in the manufacturing line, which could increase the As exposure risk and hence require extra protection and cost during the manufacturing. Additionally, the group V dopants were introduced at 1-2 at. % level (corresponding to ~$10^{20}$ cm$^{-3}$ dopants if incorporated) during the in-situ group V element doping, which is much higher than the doping demands since the doping activation efficiency is only ~1-5% to produce about 10-100 ppm doping concentration (B. E. McCandless et al., *Sci Rep*, 2018, 8, 14519-14519). In other words, most of the group V dopant source (e.g., $Cd_3As_2$), i.e., >95%, in the CdTe act as non-active impurities (A. Nagaoka, et al., *Appl Phys Express*, 2019, 12, 081002). These semi-metal $Cd_3As_2$ residual non-active dopant sources would significantly impede the electron transport and suppress the device efficiency improvement for group V doping due to the excess Cd and As related defect formation (S. Grover et al., *IEEE Photovoltaics*, 2017; T. Liang et al., *Phys Rev Lett*, 2017, 118, 136601). More importantly, localized segregation of the group V dopants and impurity cluster formation (e.g., $As_2Te_3$) were predicted in theory and experimentally observed in the in-situ As doped CdTe (H. Duan et al., *J Phys Chem Solids*, 2013, 74, 57-64; V. Barrioz et al., *MRS Proceedings*, 2007, 1012, 1012-Y1012-1008), which will not contribute to the hole concentration (G. L. Burton et al., *Sol Energ Mater Sol C*, 2018, 182, 68-75; V. Barrioz et al., *MRS Proceedings*, 2007, 1012, 1012-Y1012-1008 V. Barrioz, et al., *MRS Proceedings*, 2007, 1012, 1012-Y1012-1008). Particularly, the in-situ group V doping during the $CdCl_2$ heat treatment to passivate the as-grown group V element doped CdTe film could further increase the complicated defect chemistry in CdTe through Cl incorporation (A. Nagaoka et al., *Appl Phys Lett*, 2017, 111, 232103; A. Nagaoka et al., *Appl Phys Express*, 2019, 12, 081002; B. McCandless et al., *IEEE J Photovoltaics*, 2019, 9, 912-917; J. H. Park et al., *J Electron Mater*, 2014, 43, 2998-3003). In addition, existing ex-situ group-V doping efforts during the high temperature CdTe deposition use $Cd_3P_2$, $Cd_3As_2$ or $Cd_3Sb_2$ as the doping sources. In this case, P, As and Sb are negatively charged ions that have a much lower diffusion rate than those positively charged ions (i.e., $PCl_3$, $AsCl_3$, $SbCl_3$ and $BiCl_3$). Therefore, existing ex-situ diffusion requires a higher temperature to activate the dopants, which may damage CdTe absorber layers. Meanwhile, the extra Cd ions from the existing ex-situ Group V doping may also disturb the Cd vacancies conditions in the CdTe absorbers. Thus, what is needed are new methods for doping cadmium telluride films with group V elements. The methods disclosed herein address these and other needs.

SUMMARY

Disclosed herein are methods of diffusion-based ex-situ doping cadmium telluride with Group V element, such as P, As, Sb, or Bi, comprising depositing a cadmium telluride (CdTe) film onto a substrate; heat-treating the film with cadmium chloride ($CdCl_2$); and then contacting the heat-treated film with a solution or vapor comprising P halide, As halide, Sb halide, or Bi halide, to thereby provide a cadmium telluride film doped with P, As, Sb, or Bi.

Additional advantages will be set forth in part in the description that follows and in part will be obvious from the description or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

The details of one or more embodiments of the invention are set forth in the accompanying figures and the description below. Other features, objects, and advantages of the invention will be apparent from the description, figures, and claims.

BRIEF DESCRIPTION OF THE DRAWINGS

The accompanying drawings, which are incorporated and constitute a part of this specification, illustrate several aspects of the disclosure, and together with the description, serve to explain the principles of the disclosure.

FIG. 1a is a schematic of the method of coating $AsCl_3$ solution on the top surface of the CdSe/CdTe thin film after $CdCl_2$ heat treatment. The optical image of the clear $AsCl_3$ solution is shown. FIG. 1b is a schematic of spin coating to get the uniform $AsCl_3$ coating. FIG. 1c shows a CdSe/CdTe device fabrication with graphite paste as an electrode. FIG. 1d shows the thermal doping activation process of the As (Cu) doping. FIG. 1e is a schematic of As ion diffusion during the thermal activation process, where As diffuses along the grain boundaries.

FIG. 2a shows current-voltage (J-V) curves, FIG. 2b shows external quantum efficiency (EQE) curves of champion device performance of FTO/CdSe/CdTe/$AsCl_3$/Graphite device, and statistical distribution of $AsCl_3$ doped CdSe/CdTe devices parameters, FIG. 2c shows power conversion efficiency, PCE, FIG. 2d shows open-circuit voltage, $V_{oc}$, FIG. 2e shows short-circuit current, $J_{sc}$, FIG. 2f shows fill factor, FF, FIG. 2g shows series resistivity, $R_s$, and FIG. 2h shows shunt resistivity, $R_{sh}$.

FIG. 3a shows a Mott-Schottky plot and capacitance-voltage (C-V) behavior, FIG. 3b shows carrier density vs. depletion width profiles extracted from C-V measurement and FIG. 3c shows absorption spectra of As-doped CdTe thin film solar cells with various concentrations and comparison with optimized Cu doped CdTe solar cells.

FIGS. 4a and 4d are AFM topographical images of CuCl and $AsCl_3$ doped CdTe, FIGS. 4b and 4e are surface potential images of CuCl and $AsCl_3$ doped CdTe obtained by KPFM measurements, FIG. 4c is a surface potential histogram for CuCl and $AsCl_3$ doped CdTe devices, FIG. 4f is a profile observed from topography and surface potential images along the line indexed by the dotted line in FIG. 4a, FIG. 4b, FIG. 4d, and FIG. 4e. FIG. 4g is a cross-sectional scanning electron microscopy image, and elemental EDX mapping for the $AsCl_3$ doped CdTe annealed at 240° C. for 20 mins and FIG. 4h is an elemental analysis of the FTO/CdSe/CdTe interface for $AsCl_3$ doped CdTe.

FIGS. 5a-5c are J-V curves, FIG. 5d shows power conversion efficiency, PCE, FIG. 5e shows open-circuit voltage, $V_{oc}$, FIG. 5f shows short-circuit current, $J_{sc}$, FIG. 5g shows fill factor, FF, FIG. 5h shows series resistivity, $R_s$, and FIG. 5i shows shunt resistivity, $R_{sh}$, for the room temperature (RT), 200° C. for 10 min, 20 min and 30 min, respectively. The error bar (±0.2 V) was not shown here to see the device performance change.

FIG. 6a shows power conversion efficiency, PCE, FIG. 6b shows open-circuit voltage, $V_{oc}$, FIG. 6c shows short-circuit current, $J_{sc}$, FIG. 6d shows fill factor, FF, FIG. 6e shows series resistivity, $R_s$, and FIG. 6f shows shunt resistivity, $R_{sh}$. The error bar (±0.2 V) is not shown here to clearly see the device performance change.

DETAILED DESCRIPTION

Figures 1A, 1B, 1C, 1D, 1E:
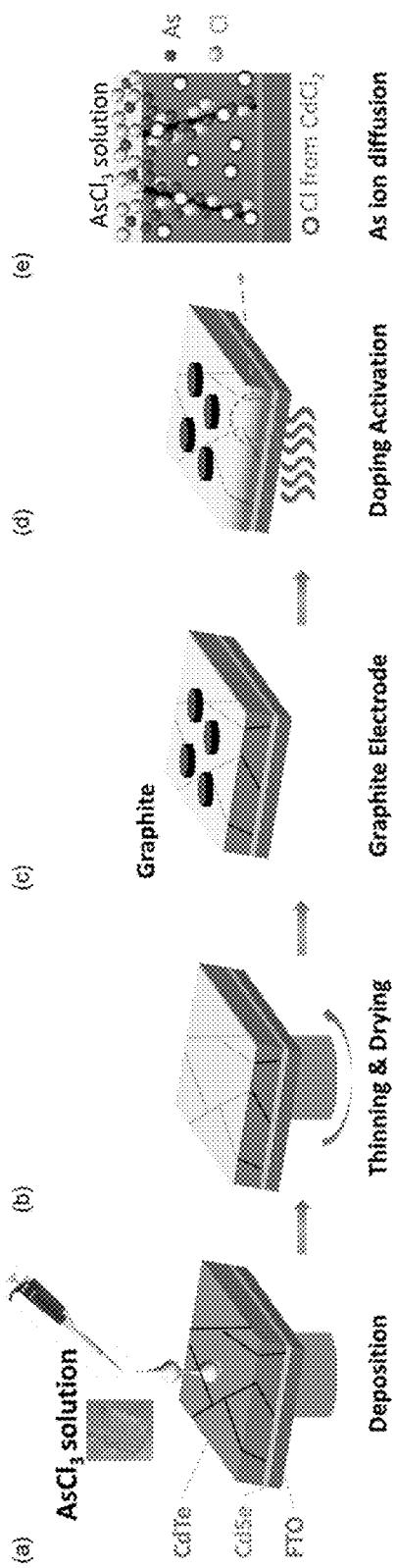
FIGS. 1a-1e: Solution-processed ex-situ As doping schematic in CdSe/CdTe device.

The devices and methods described herein may be understood more readily by reference to the following detailed description of specific aspects of the disclosed subject matter, figures, and the examples included therein.

Before the present devices and methods are disclosed and described, it is to be understood that the aspects described below are not intended to be scope by the specific systems, methods, articles, and devices described herein, which are intended as illustrations. Various modifications of the systems, methods, articles, and devices in addition to those shown and described herein are intended to fall within the scope of that described herein. Further, while only certain representative systems and method steps disclosed herein are specifically described, other combinations of the systems and method steps also are intended to fall within the scope of that described herein, even if not specifically recited. Thus, a combination of steps, elements, components, or constituents may be explicitly mentioned herein or less, however, other combinations of steps, elements, components, and constituents are included, even though not explicitly stated.

Definitions

The term "comprising" and variations thereof as used herein is used synonymously with the term "including" and variations thereof and are open, non-limiting terms. Although the terms "comprising" and "including" have been used herein to describe various examples, the terms "consisting essentially of" and "consisting of" can be used in place of "comprising" and "including" to provide for more specific examples of the invention and are also disclosed. Other than in the examples, or where otherwise noted, all numbers expressing quantities of ingredients, reaction conditions, and so forth used in the specification and claims are to be understood at the very least and not as an attempt to limit the application of the doctrine of equivalents to the scope of the claims, to be construed in light of the number of significant digits and ordinary rounding approaches.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components and the like.

"Optional" or "optionally" means that the subsequently described event or circumstance can or cannot occur and that the description includes instances where the event or circumstance occurs and instances where it does not.

It is understood that throughout this specification the identifiers "first," "second," and "third" are used solely to aid in distinguishing the various components and steps of the disclosed subject matter. The identifiers "first," "second," and "third" are not intended to imply any particular order, amount, preference, or importance to the components or steps modified by these terms.

For the terms "for example" and "such as," and grammatical equivalences thereof, the phrase "and without limitation" is understood to follow unless explicitly stated otherwise.

Ranges can be expressed herein as from "about" one particular value and/or to "about" another particular value. When such a range is expressed, another aspect includes from the one particular value and/or to the other particular value. Similarly, when values are expressed as approximations, by use of the antecedent "about," it will be understood that the particular value forms another aspect. It should be further understood that the endpoints of each of the ranges are significant both in relation to the other endpoint and independently of the other endpoint.

Similarly, when values are expressed as approximations, by use of the antecedent "about," it will be understood that the particular value forms another aspect. It will be further understood that the endpoints of each of the ranges are significant both in relation to the other endpoint and independently of the other endpoint. Unless stated otherwise, the term "about" means within 5% (e.g., within 2% or 1%) of the particular value modified by the term "about."

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6, etc., as well as individual numbers within that range, for example, 1, 2, 2.7, 3, 4, 5, 5.3, 6 and any whole and partial increments therebetween. This applies regardless of the breadth of the range.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

Terms used herein will have their customary meaning in the art unless specified otherwise.

Reference will now be made in detail to specific aspects of the disclosed materials, compounds, compositions, articles, and methods, examples of which are illustrated in the accompanying examples and figures.

Methods

Ex-situ group V element doping through diffusion has been investigated post CdTe deposition but focused before the $CdCl_2$ heat treatment, such as P implanted into polycrystalline CdTe (C. Kraft et al., *Phys Rev Appl*, 2016, 5, 054014), P, As, and Sb diffused into single crystal CdTe by thermal annealing with $Cd_3P_2$, $Cd_3As_2$ and CdSb (E. Colegrove et al., *Thin Solid Films*, 2002, 403, 216-222). However, it is desirable to develop low-temperature ex-situ doping methods in CdTe to decouple the high-temperature $CdCl_2$ heat treatment and doping activation process. For example, $As_2Te_3$ and $Sb_2Te_3$ back contact was used for CdTe devices to introduce As and Sb doping. But the doping is not definitive, and Cu doping is still needed (N. Romeo, A. Bosio and G. Rosa, presented in part at the Proceedings of SWC2017/SHC2017, 2017). It is also demonstrated that the post-CdTe deposition in the diffusion of $Cd_2As_3$ led to significant dopant segregation to the grain boundaries (W. K. Metzger et al., *Nature Energy*, 2019). Meanwhile, it is desired to make an effective group V doping similar to that of the matured Cu doping during the conventional CdTe module manufacturing in order to reduce the manufacturing cost and also to minimize the As footprint. Although it is demonstrated that the ex-situ diffusion doping in CdTe can be achieved through the group V doped ZnTe back contact (e.g., P, As and Sb doped ZnTe) (E. Colegrove et al., *IEEE*

*J Photovoltaics,* 2017, 7, 870-873; G. K. Ochai Oklobia, and Stuart J. C. Irvine, PVSAT-15 Proceeding, 2015), the faster diffusion along grain boundaries than the substitutional bulk diffusion makes the uniform doping and the doping activation a challenge.

Recently, it was shown that Cu can be doped into CdTe through a well-prepared Cu ion solution, such as CuCl, CuSCN and $CuCl_2$ (E. Artegiani et al., *Progress in Photovoltaics: Research and Applications,* 2019, 27, 706-715; A. Montgomery et al., *Progress in Photovoltaics: Research and Applications,* 2019, 27, 665-672; S. Paul et al., *Thin Solid Films,* 2019, 685, 385-392). The solution process of Cu incorporation into the CdTe device allows uniform coverage of the CdTe film, reduction of the incorporated Cu quantity, and also the cost of Cu doping.

Disclosed herein, Group V ex-situ doping (P, As, Sb, Bi) was successfully doped into CdS/CdTe and CdSe/CdTe solar cells after the $CdCl_2$ heat treatment through an ex-situ solution and vapor process using group V halide, such as $PCl_3$, $AsCl_3$, $SbCl_3$ and $BiCl_3$ as the dopant source with quantitative control of the dopant concentration, and followed by a separated low-temperature thermal activation process. For instance, by coupling the As doping and high photocurrent of CdSe/CdTe device, a champion device with $AsCl_3$ solution doped CdTe device can reach PCE~18.2% with significantly improved stability better than that of the well-optimized CuCl solution doped CdSe/CdTe device. The $AsCl_3$ solution has limited impact on the intrinsic Cd defects in the CdTe device because no extrinsic Cd ions were introduced, unlike the widely used $Cd_3As_2$ doping source. Meanwhile, the extra Cl from $AsCl_3$ (or another group V halide) may also benefit the CdTe devices to compensate for the loss of Cl, to passivate the grain boundaries, and also to increase the carrier collection (J. D. Poplawsky et al., *Adv Energy Mater,* 2014, 4, 1400454; A. H. Munshi et al., *Sol Energy Mater Sol C,* 2018, 186, 259-265). The CdSe/CdTe device has the benefit of forming the CdSeTe grading absorber in the CdTe to achieve higher photocurrent (J. D. Poplawsky et al., *Nat Commun,* 2016, 7, 12537; T. A. M. Fiducia et al., *Nature Energy,* 2019, 4, 504-511). The use of $AsCl_3$ solution or vapor, or another group V halide, could decouple the group V doping in the CdTe device, CdTe deposition and $CdCl_2$ heat treatment to prevent the Cd-rich associated defects using $Cd_3As_2$ as the dopants during in-situ doping, which could significantly reduce the As or another group V element footprint during the doped CdTe solar module manufacturing. Particularly, this ex-situ solution or vapor-processed doping can accurately control the doping concentration at ppm level through the solution concentration manipulation, which is cost-effective and can be directly integrated into the CdTe solar module production to further reduce the solar energy cost.

In specific aspects disclosed herein are methods of ex-situ doping cadmium telluride (CdTe) with P, As, Sb, or Bi, comprising depositing a cadmium telluride (CdTe) film onto a substrate; heat-treating the film with $CdCl_2$; and then contacting the heat-treated film with a solution or vapor comprising P halide, As halide, Sb halide, or Bi halide, to thereby provide a cadmium telluride film doped with P, As, Sb, or Bi.

In specific examples, the substrate can be a transparent conducting oxide (TCO) selected from indium doped tin oxide (ITO), fluorine-doped tin oxide (FTO), aluminum-doped ZnO (AZO), or a combination thereof. Such substrates are used, for example, in solar cells as electrodes. In specific examples, the substrate can further comprise a cadmium selenide, cadmium sulfide, or ZnMgO layer, as a buffer layer onto which the cadmium telluride is deposited. This buffer layer can, for example, have an average thickness of about 20 nm or more (e.g., about 30 nm or more, about 40 nm or more, about 50 nm or more, about 60 nm or more, about 70 nm or more, about 80 nm or more, about 90 nm or more, about 100 nm or more, about 110 nm or more, about 120 nm or more, about 130 nm or more, about 140 nm or more, about 150 nm or more, about 200 nm or more, about 250 nm or more, about 300 nm or more, about 350 nm or more, about 400 nm or more, about 450 nm or more, about 500 nm or more, about 600 nm or more, about 700 nm or more, or about 800 nm or more). In some examples, the buffer layer can have an average thickness of about 1,000 nm or less (e.g., about 900 nm or less, about 800 nm or less, about 700 nm or less, about 600 nm or less, about 500 nm or less, about 450 nm or less, about 400 nm or less, about 350 nm or less, about 300 nm or less, about 250 nm or less, about 200 nm or less, about 150 nm or less, about 140 nm or less, about 130 nm or less, about 120 nm or less, about 110 nm or less, about 100 nm or less, about 90 nm or less, about 80 nm or less, about 70 nm or less, about 60 nm or less, about 50 nm or less, or about 40 nm or less).

The average thickness of the buffer layer can range from any of the minimum values described above to any of the maximum values described above. The buffer layer can, for example, have an average thickness of from about 20 nm to about 1,000 nm (e.g., from about 20 nm to about 500 nm, from about 500 nm to about 1,000 nm, from about 20 nm to about 200 nm, from about 200 nm to about 400 nm, from about 400 nm to about 600 nm, from about 600 nm to about 800 nm, from about 800 nm to about 1,000 nm, from about 20 nm to about 800 nm, from about 20 nm to about 600 nm, from about 20 nm to about 400 nm, from about 20 nm to about 200 nm, from about 50 nm to about 150 nm, or from about 90 nm to about 110 nm).

The buffer layer can, for example, be deposited on the substrate by chemical bath deposition, physical vapor deposition, atomic layer deposition, spray pyrolysis or chemical vapor deposition.

In specific examples, depositing the cadmium telluride film is by closed space sublimation, vapor transport deposition, metal-organic chemical vapor deposition, electrodeposition, elemental vapor transport, or molecular beam epitaxy. In specific examples, depositing the cadmium telluride film onto the substrate is performed in the absence of P, As, Sb, or Bi. The resulting cadmium telluride film can be polycrystalline.

The cadmium telluride film can, for example, have an average thickness of about 0.1 µm or more (e.g., about 0.2 µm or more, about 0.3 µm or more, about 0.4 µm or more, about 0.5 µm or more, about 0.6 µm or more, about 0.7 µm or more, about 0.8 µm or more, about 0.9 µm or more, about 1 µm or more, about 1.1 µm or more, about 1.2 µm or more, about 1.3 µm or more, about 1.4 µm or more, about 1.5 µm or more, about 1.6 µm or more, about 1.7 µm or more, about 1.8 µm or more, about 1.9 µm or more, about 2 µm or more, about 2.25 µm or more, about 2.5 µm or more, about 2.75 µm or more, about 3 µm or more, about 3.25 µm or more, about 3.5 µm or more, about 3.75 µm or more, about 4 µm or more, about 4.25 µm or more, or about 4.5 µm or more). In some examples, the cadmium telluride film can have an average thickness of about 5 µm or less (e.g., about 4.75 µm or less, about 4.5 µm or less, about 4.25 µm or less, about 4 µm or less, about 3.75 µm or less, about 3.5 µm or less, about 3.25 µm or less, about 3 µm or less, about 2.75 µm or less, about 2.5 µm or less, about 2.25 µm or less, about 2 µm or less, about 1.9 µm or less, about 1.8 µm or less, about 1.7 µm or less, about 1.6 µm or less, about 1.5 µm or less, about 1.4 µm or less, about 1.3 µm or less, about 1.2 µm or less, about 1.1 µm or less, about 1 µm or less, about 0.9 µm or less, about 0.8 µm or less, about 0.7 µm or less, about 0.6 µm or less, about 0.5 µm or less, about 0.4 µm or less, or about 0.3 µm or less). The average thickness of the cadmium telluride film can range from any of the minimum values described above to any of the maximum values described above. The cadmium telluride film can, for example, have an average thickness of from about 0.1 µm to about 5 µm (e.g., from about 0.1 µm to about 2.5 µm, from about 2.5 µm to about 5 µm, from about 0.1 µm to about 1 µm, from about 1 µm to about 2 µm, from about 2 µm to about 3 µm, from about 3 µm to about 4 µm, from about 4 µm to about 5 µm, from about 0.1 µm to about 4 µm, from about 0.3 µm to about 3 µm, or from about 0.6 µm to about 2 µm).

Heat treating the cadmium telluride film can be accomplished by contacting the film with $CdCl_2$ and heating at from about 200° C. to about 600° C., e.g., about 200° C., about 250° C., about 300° C., about 350° C., about 400° C., about 450° C., about 500° C., about 550° C., or about 600° C., where and of the stated values can form an upper or lower endpoint of a range. In specific examples, after the cadmium telluride film is heat-treated, but before it is contacted with the solution, the cadmium telluride film is cleaned. Further, after the heat treatment, the film can be allowed to cool to about 200° C. or below.

In specific examples, the heat-treated (e.g., and also cooled) film is then contacted with a solution or vapor comprising As halide, P halide, Sb halide, or Bi halide. Halides, such as chlorides, can enable effective diffusion of group V ions at much lower temperatures and do not require an additional activation process. Contacting the heat-treated film with the solution or vapor can be by spin coating, dip coating, slot die, or spraying the solution and vapor onto the CdTe film. In specific examples, the solution or vapor can comprise from about 1 to about 1,000 mg/L of the P halide, As halide, Sb halide, or Bi halide, including exemplary values of about 2 mg/L, about 3 mg/L, about 4 mg/L, about 5 mg/L, about 6 mg/L, about 7 mg/L, about 8 mg/L, about 9 mg/L, about 10 mg/L, about 12 mg/L, about 15 mg/L, about 20 mg/L, about 30 mg/L, about 50 mg/L, about 75 mg/L, about 100 mg/L, about 150 mg/L, about 200 mg/L, about 250 mg/L, about 300 mg/L, about 350 mg/L, about 400 mg/L, about 450 mg/L, about 500 mg/L, about 550 mg/L, about 600 mg/L, about 650 mg/L, about 700 mg/L, about 750 mg/L, about 800 mg/L, about 850 mg/L, about 900 mg/L, and about 950 mg/L. In one specific and unlimiting example, the solution or vapor can comprise about 10 mg/L of the As halide, P halide, Sb halide, or Bi halide. In specific examples, the P halide, As halide, Sb halide, or Bi halide is $AsCl_3$, $PCl_3$, $SbCl_3$, $BiCl_3$. In specific examples, the heat-treated film is contacted with a solution or vapor of $AsCl_3$. In specific examples, the solution further comprises methanol, ethanol, propanol, isopropanol, butanol, pentanol, benzene, or carbon sulfide, or any combination thereof.

Further, when contacting the heat-treated CdTe film with the solution or vapor, it is done under a dry inert gas. The group V dopants should be protected by a dry gas such as $N_2$ or Ar to prevent moisture and oxygen reaction on the CdTe surface.

Contacting the heat-treated CdTe film with the solution or vapor can be done at low temperatures, e.g., lower than the heat-treatment step with $CdCl_2$. These temperatures can range from about 400° C., or lower, e.g., about 350° C., about 300° C., about 250° C., about 200° C., about 150° C., about 100° C., about 50° C., or below.

In specific examples, wherein after the heat-treated CdTe film is coated with the solution, the film is further contacted with graphite or a metal contact.

In specific examples, after the CdTe film is coated with the solution or vapor, the film is further heated to activate the group V dopants. This second heat treatment step can be performed at from about 200° C. to about 600° C., e.g., about 200° C., about 250° C., about 300° C., about 350° C., about 400° C., about 450° C., about 500° C., about 550° C., or about 600° C., where and of the stated values can form an upper or lower endpoint of a range.

Examples

Materials: $AsCl_3$ (99.999% Alfa Aesar), $PCl_3$ (99.99% Alfa Aesar), $BiCl_3$ (99.99% Alfa Aesar), ($SbCl_3$, 99.99% Alfa Aesar) anhydrous isopropanol (99.9% J. T. Baker), and $CdCl_2$ (99.99%, Alfa Aesar), CuCl (99.999%, Alfa Aesar) were commercial products. The solvents were of analytical purity grade and used as received without further purification.

Deposition of CdTe thin film and $CdCl_2$ heat treatment: The CdTe film with ~3-4 µm was deposited on Fluorine-doped $SnO_2$ (FTO, NSG USA) substrate with a 100 nm CdSe window layer by using the closed space sublimation (CSS). The detailed CSS deposition process was reported elsewhere (N. R. Paudel et al., 015 IEEE 42nd Photovoltaic Specialist Conference (PVSC), 2015, pp. 1-3). The $CdCl_2$ heat treatment for the CdTe thin film was carried out at 400° C. for 20 mins in the ambient with $CdCl_2$ solution spray and fully dry on the as-deposited CdTe. The CdTe surface after the $CdCl_2$ heat treatment was rinsed using deionized water (DIW) to remove the residual $CdCl_2$, followed by an etching process using the diluted HCl solution to remove the surface oxides layer before the $AsCl_3$ coating and back contact deposition.

Preparation of $AsCl_3$ and CuCl doping solution: $AsCl_3$ was dissolved into anhydrous isopropanol at a concentration of 1 to 100 mg/L. Note that $AsCl_3$ is highly toxic and should be handled in the glovebox or chemical hood carefully. CuCl was dissolved into deionized water at a concentration of 1 to 100 mg/L. The solutions were magnetically stirred at room temperature to get fully dissolved and filtered using a 0.45 µm pore size PTFE filter prior to the spin-coating deposition of a thin film.

Preparation of the solution-processed $AsCl_3$ and CuCl doped CdTe devices: The $AsCl_3$ (CuCl) thin film was spin-coated with a rotation speed of 500 rpm for 10 s to control the $AsCl_3$ (CuCl) doping concentration by tuning the dopants solution concentration (1-100 mg/L). The back contact for the CdTe cells was screen printed graphite and Ag paste without an intentional Cu source. The cell area is 0.08 $cm^2$.

Thermal activation of the dopants in CdTe devices: The finished $AsCl_3$ and CuCl doped CdTe device was heated to convert electronically inactive As and Cu into ASTe and $Cu_{Cd}$ acceptors, respectively, by diffusing the As and Cu into the CdTe. The dopants were thermally activated for various durations (10 to 30 min) and at different temperatures (200° C. to 240° C.) to investigate the activation process of the As (Cu) doping in the CdTe.

Surface potential measurement for the doped CdTe: The atomic force microscopy (AFM) and Kelvin probe force microscopy (KPFM) studies were conducted using atomic force microscopy (AFM, Park XE70) using a Pt/Ir coated contact probe (PPP-EFM from Nanosensors). The cantilever spring constant was about 2.8 N/m, and the resonance frequency was ~ 75 kHz. The work function of the metallic tip was calibrated using a highly oriented pyrolytic graphene (HOPG) sample.

Characterization and measurement of doped CdTe solar cell: The current-voltage (J-V) curve of the solar cells was characterized using a solar simulator (Newport, Oriel Class AAA 94063A, 1000 Watt Xenon light source) with a source meter (Keithley 2420) at 100 mW cm$^{-2}$ AM 1.5G irradiation. A calibrated Si-reference cell and meter (Newport, 91150V, certificated by NREL) was used to calibrate the solar simulator prior to the cell's measurement. External quantum efficiency (EQE) data were characterized by a solar cell spectral response measurement system (QE-T, Enli Technology, Co. Ltd). Capacitance-voltage (C-V) measurements were performed using a Solartron Analytical 1260 impedance analyzer equipped with a 1296 dielectric interface. The C-V measurements were performed in the dark with a constant 30 mV rms 10 kHz AC signal superimposed on a DC bias voltage varying from 1.2 to 0.6 V. Light soaking test was performed using a solar simulator with 1 Sunlight intensity (100 mWcm$^{-2}$) and heat stage kept at 85° C. with humidity around 80%.

Results

The CSS deposited CdTe film (~3-4 μm) with sputtered CdSe buffer layer (~100 nm) on FTO substrate was carried out along with the $CdCl_2$ treatment as mentioned previously (A. Montgomery et al., *Progress in Photovoltaics: Research and Applications*, 2019, 27, 665-672). After the $CdCl_2$ treatment, the surface of CdTe was cleaned using DIW and diluted HCl solution to remove the residual $CdCl_2$ and oxides layer, respectively. To apply the As doping, the $AsCl_3$ solution of various concentrations (e.g., 1, 10 and 100 mg/L) was spin-coated on the CdTe surface as shown in FIGS. 1a-1e. After the $AsCl_3$ dried, a graphite electrode with an area of 0.08 cm$^2$ was screen printed on the CdTe surface as shown in FIG. 1c. Then the cells underwent heat treatment for varying durations of time and temperature to cure the graphite electrode, to promote the proper ohmic contact formation and also for the diffusion of As from the surface to the bulk of CdTe (FIG. 1d). This diffusion process can activate the As doping efficiently, and the As and Cl ions can diffuse along the CdTe grain boundaries much faster than the intra-grain, as shown in FIG. 1e.

To make the comparison, a CuCl solution was used for Cu doping in identical CdSe/CdTe devices. An optimized CuCl concentration (100 mg/L) was used as a control for the $AsCl_3$ doping effect in this study. Note that the CdTe post $CdCl_2$ will have a significant Cl segregation along the CdTe grain boundaries and limited distribution in the intra-grain (D. Mao, et al., *IEEE J Photovoltaics*, 2014, 4, 1655-1658), and the applied $AsCl_3$ or CuCl solution could bring more Cl ions for the system, which could further passivate the grain boundaries during the thermal activation process.

FIGS. 2a-2h show the device performance and statistic distribution of device parameters for the ex-situ $AsCl_3$ doped CdSe/CdTe solar cells with the glass/FTO/CdSe/CdTe/$AsCl_3$/graphite structure by tuning the $AsCl_3$ solution concentration from 1 to 100 mg/L. The device performance of the solution-processed CuCl doped CdTe device was also included as a control for the $AsCl_3$ doped CdSe/CdTe devices. The champion device's current-voltage (J-V) curve and external quantum efficiency (EQE for the $AsCl_3$ and optimized CuCl (e.g., 100 mg/L) doped CdSe/CdTe devices were shown in FIGS. 2a and 2b, respectively. It is shown that the $AsCl_3$ doped CdTe devices with varying As concentration could achieve equal or better device performance as that of the optimized CuCl doped CdTe devices. The detailed champion device parameters are listed in Table 1, and the detailed device parameters distribution is shown in FIGS. 2c-2h, where the average $V_{oc}$ of the $AsCl_3$ doped CdTe is slightly lower than that of the CuCl doped CdTe device. The average $V_{oc}$ of ex-situ As doped CdTe is also lower than that of the reported in-situ As doped polycrystalline CdTe device (856 mV) (W. K. Metzger et al., *Nature Energy*, 2019). However, the best $V_{oc}$ for the As doped CdTe can be 872 mV for the $AsCl_3$ 10 mg/L (FIG. 2d), which is close to the reported record polycrystalline CdTe devices (e.g., 887 mV). Overall, the $AsCl_3$ doped CdTe device has a lower $V_{oc}$ than that of the CuCl doped CdTe devices with V ~10-30 mV. The relatively low $V_{oc}$ using solution-processed $AsCl_3$ doping source can be due to the As diffusion gradient and carrier collection variation at the back contact. Particularly, the $V_{oc}$ of $AsCl_3$ doped CdTe devices is gradually increased with increasing the As concentration (FIG. 2d), suggesting that the As doping carrier concentration is increased by more As incorporation and conversion into $As_{Te}$ acceptors. However, the $J_{sc}$ of $AsCl_3$ doped CdSe/CdTe device is higher than that of the CuCl doped device (FIG. 2e), which can be ascribed to the p-type $As_2Te_3$ formation at the back surface to form better ohmic contact than $Cu_2Te$ back contact, which can boost the photogenerated carrier collection (V. Barrioz et al., *MRS Proceedings*, 2007, 1012, 1012-Y1012-1008). Meanwhile, with increasing $AsCl_3$ concentration from 1 to 10 mg/L, the series resistivity ($R_s$, FIG. 2g) can be significantly reduced, and high shunt resistivity ($R_{sh}$, FIG. 2h) can be achieved, which leads to an increased fill factor (FF). However, with a further increase in the $AsCl_3$ concentration from 10 to 100 mg/L, the FF dropped dramatically, $R_s$ remained stable, and $R_{sh}$ decreased on average. Thus, this reduced FF can be ascribed to the shunting with more As incorporation and As-associated impurities, e.g., semi-metal $Cd_2As_3$, which may be generated in the CdTe absorber (T. Liang et al., *Phys Rev Lett*, 2017, 118, 136601). Thus, the optimal $AsCl_3$ concentration is 10 mg/L with a champion device PCE of 18.2%, $V_{oc}$~ 829 mV, $J_{sc}$~ 30.4 and FF 72.28%.

The long-wavelength (from 650 to 850 nm) EQE response of the $AsCl_3$ doped CdSe/CdTe devices is lower than that of the optimized CuCl doped CdTe device, which is in agreement with the in-situ As doped CdTe because the As doping can limit the carrier collection at the back contact (G. Kartopu et al., *Sol Energy Mater Sol C*, 2019, 194, 259-267). In addition, it is shown that with an increase in the As concentration (e.g., from 10 to 100 mg/L), both the long-wavelength (from 650 to 850 nm) and short-wavelength (from 300 to 400 nm) collection efficiency decreases, which can be due to the As diffusion to the front contact in the $SnO_2$ and it segregates at the CdSe/FTO interface and results in the reduced light absorption (C. L. Perkins et al., *ACS Appl Mater & Interfaces*, 2019, 11, 13003-13010).

TABLE 1

Device parameters of PCE champion CdTe cells
with AsCl₃ doping compared with CuCl doping.

| CuSCN solvent | Solution conc. | $V_{oc}$, V | $J_{sc}$, mAcm$^{-2}$ | FF, % | $R_s$, Ω cm² | $R_{sh}$, Ω cm² | PCE, % |
|---|---|---|---|---|---|---|---|
| CuCl | 100 mg/L | 0.844 | 29.8 | 69.13 | 47.6 | 10157 | 17.44% |
| AsCl₃ | 100 mg/L | 0.838 | 30.87 | 68.00 | 50.8 | 16955 | 17.61% |
| AsCl₃ | 10 mg/L | 0.829 | 30.4 | 72.28 | 39.7 | 13961 | 18.21% |
| AsCl₃ | 1 mg/L | 0.823 | 30.4 | 71.03 | 39.2 | 16025 | 17.80% |

Figures 2A, 2B, 2C, 2D, 2E, 2F, 2G, 2H:
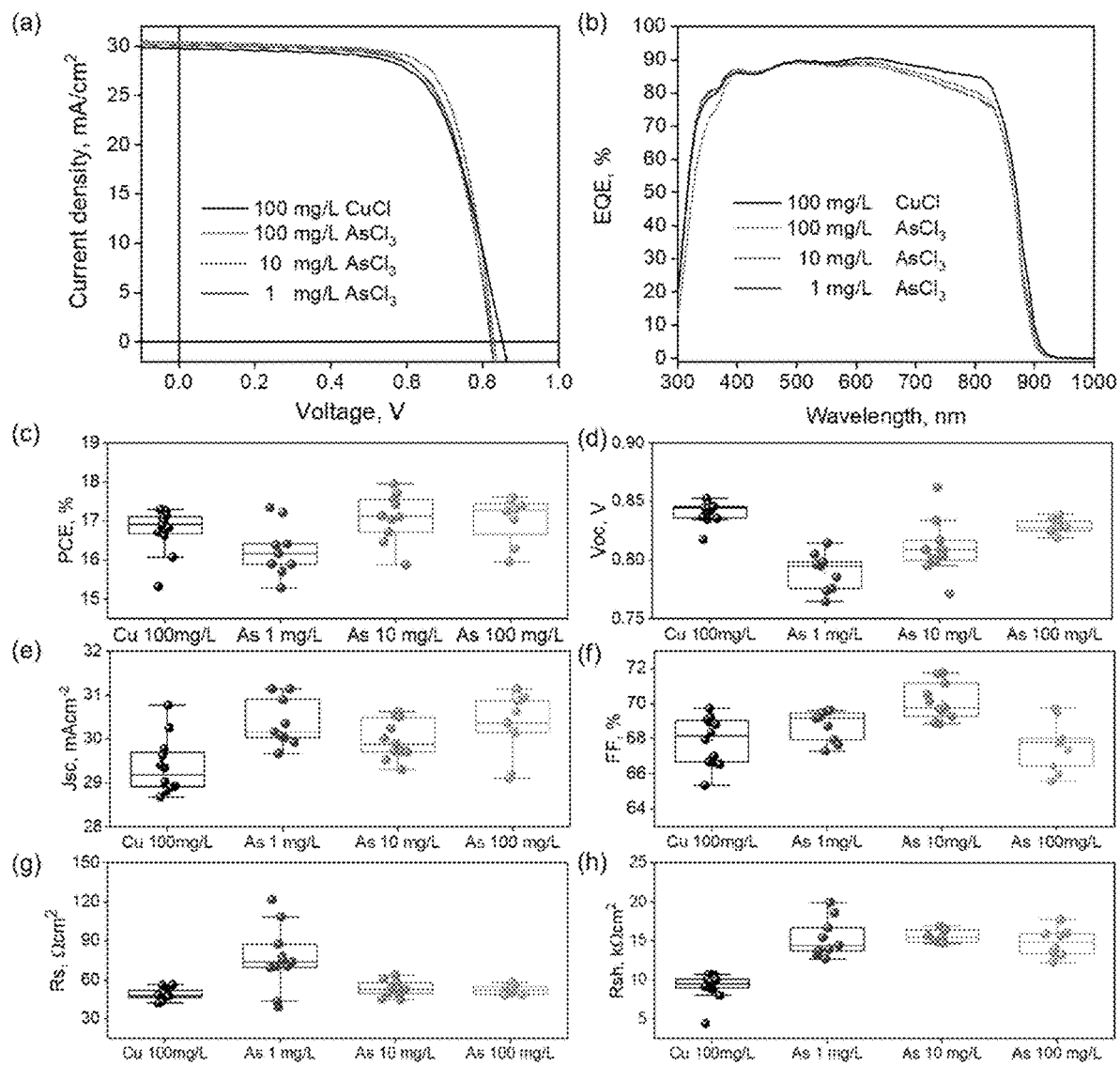
FIGS. 2a-2h: Device performance of the solution process ex-situ doped CdTe.
Figures 3A, 3B, 3C:
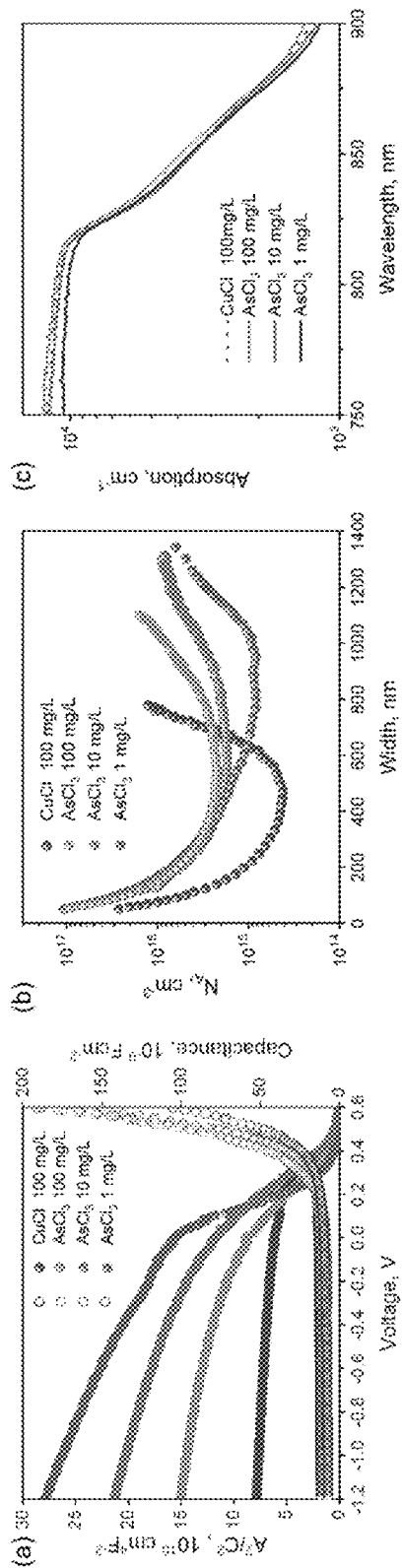
FIGS. 3a-3c: Electronic and photonic properties of the ex-situ As doped CdTe.

To better understand the AsCl₃ doped CdSe/CdTe device performance, the carrier doping concentration (NA) was analyzed using the capacitance-voltage measurement (C-V). The Mott-Schottky plot and C-V plot for the CuCl and AsCl₃ doped CdSe/CdTe devices are shown in FIG. 3a. It is observed that the built-in potential voltage ($V_{bi}$) is about 0.5 V for 100 mg/L CuCl, 10 and 100 mg/L AsCl₃ by extracting the intercept of the $A^2/C^2$-V straight line, while the AsCl₃ doped CdTe has a $V_{bi}$ of 0.42 V. The decrease of $V_{bi}$ at 1 mg/L AsCl₃ doped CdTe device can be the cause for the reduced $V_{oc}$ at AsCl₃ 1 mg/L doped CdTe devices. FIG. 2b displays the NA vs. depletion width derived from C-V measurements for CuCl and AsCl₃ doped CdTe device. The CuCl doped CdTe can achieve NA~5×10$^{14}$ cm$^{-3}$ at 0 V, which is similar to the reported results for CuCl₂ and CuCl doped CdTe device (E. Artegiani et al., *Progress in Photovoltaics: Research and Applications*, 2019, 27, 706-715; J. Huang et al., *Appl Surface Sci*, 2019, 484, 1214-1222). NA in the AsCl₃ doped CdTe devices can be 1×10$^{15}$ to 3×10$^{15}$ cm$^{-3}$ at 0 V, which is higher than that of the CuCl doped CdTe. Although this carrier concentration is still lower than that of the in-situ As doped polycrystalline CdTe device using VTD (>10$^{16}$ cm$^{-3}$), this level of ex-situ AsCl₃ doped CdTe is similar to that of the in-situ As doped CdTe using the MOCVD method (Y. Y. Proskuryakov, K et al., *Sol Energy Mater Sol C*, 2009, 93, 1572-1581). Additionally, the depletion width of AsCl₃ doped CdTe devices is wider than that of the CuCl doped CdTe devices, which can benefit the carrier collection for the AsCl₃ doped devices. Moreover, with increasing the As solution concentration from 1 mg/L to 100 mg/L, the depletion width becomes narrow, which is in agreement with the in-situ As doped CdTe device due to the improved As doping incorporation (B. E. McCandless et al., *Sci Rep*, 2018, 8, 14519-14519; G. Kartopu et al., *Sol Energy Mater Sol C*, 2019, 194, 259-267).

The optical absorption spectra at the long-wavelength further confirm the As incorporation into the CdTe with infrared shift with increasing As concentration (FIG. 3c), which could be ascribed to more below-band absorption by As$_{Te}$ substitution defects formation (G. L. Burton et al., *Sol Energ Mater Sol C*, 2018, 182, 68-75; W. K. Metzger et al., *Nature Energy*, 2019). However, the doping profile also indicates that the ex-situ As doping by the As diffusion from the CdTe surface could generate the dopant concentration gradient. With the determined NA, the dopant activation efficiency can be calculated to be 1% via NA/[As], where [As] is the applied As dopant bulk concentration, here it is 1-100 mg/L AsCl₃ concentration corresponding to 10$^{18}$-10$^{20}$ cm$^{-3}$, which is similar to the As doping by other in-situ and ex-situ methods (Id., A. Nagaoka, et al., *Appl Phys Express*, 2019, 12, 081002). This level of doping activation efficiency is still a challenge with Group V elements no matter whether in-situ or ex-situ doping methods are employed. However, solution-processed ex-situ doping provides more freedom to further engineer the doping concentration and also to activate the As doping by changing the activation process without interrupting the intrinsic Cd atmosphere like using Cd₃As₂ during in-situ As doping.

To elucidate the local variation of $V_{oc}$ in the As doped CdTe devices, Kelvin probe force microscopy (KPFM) was implemented under illumination (FIGS. 4a-4h). The photovoltage signal, i.e., contact potential difference (CPD), is proportional to the work function difference between the metallic tips ($W_{tip}$) and the surface of the CdTe ($W_{CdTe}$) as $qV_{CPD} = W_{tip} - W_{CdTe}$, where q is the electron charge and $V_{oc} = V_{CPD}^{Light} - V_{CPD}^{Dark}$.[58] During the KPFM scan, both the surface topography and the surface potential will be collected during a two-pass KPFM scan.

Figures 4A, 4B, 4C, 4D, 4E, 4F, 4G, 4H:
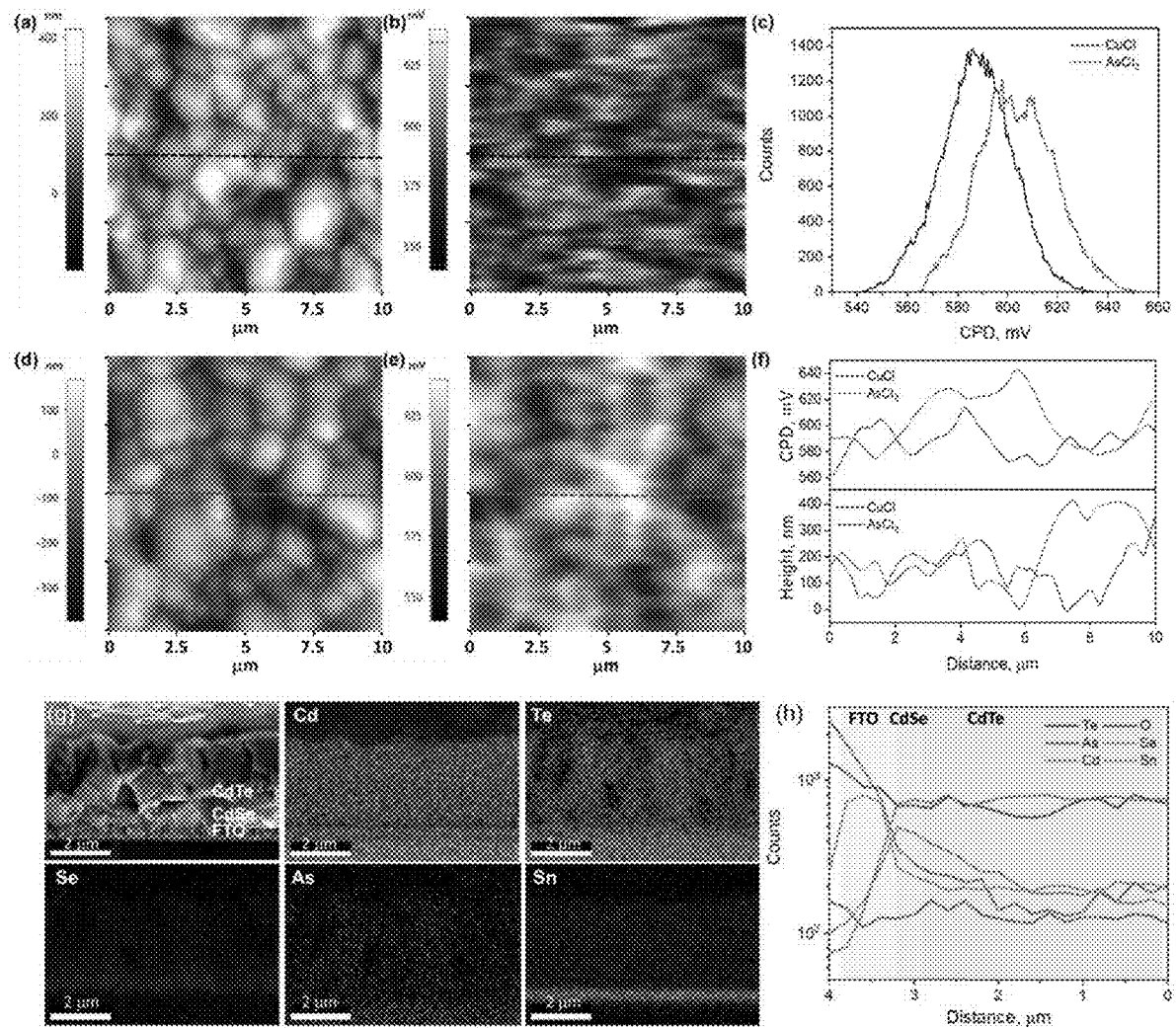
FIGS. 4a-4h: Morphology and surface potential of the doped CdTe devices.

As shown in FIGS. 4a and 4d, the topography of the 100 mg/L CuCl and 10 mg/L AsCl₃ were scanned. The grain size was found to be about 1~2 μm. The KPFM CPD images of the 100 mg/L CuCl and 10 mg/L AsCl₃ are shown in FIGS. 4b and 4e, where the correlation between the topographical features and CPD is limited because the KPFM scan lift height to remove the topography impact on the surface potential. The histograms of the CPD images for both CuCl and AsCl₃ doped CdTe are shown in FIG. 4c, indicating that the CPD~605 mV of AsCl₃ doped CdTe shows ~25 mV higher potential than that of the CuCl doped CdTe (CPD~580 mV). Without wishing to be bound by any theory, this higher CPD by As doping in CdTe suggests that the As doped CdTe should possess higher $V_{oc}$. However, the measured $V_{oc}$ for J-V (FIG. 2c) shows that CuCl doped CdTe has a higher overall $V_{oc}$. To ascertain this mystery, the correlation line-scans between the topography and CPD (FIG. 4f) were collected, and it suggested that the AsCl₃ doped CdTe possess a higher local shift CPD at the grain boundaries. These local photovoltage shifts can be associated with the p-type character of the As doped CdTe (W. S. M. Brooks et al., *Semiconductor Sci Technol*, 2013, 28, 105024). However, the larger localized band bending at As segregated grain boundaries can also lead to faster-photogenerated carrier transport and collection which could result in increased photocurrent. Thus, although As doped CdTe has higher localized photovoltage associated with the increased charge separation at the grain boundaries, this local faster charge transport may reduce $V_{bi}$ and lead to an overall reduction in $V_{oc}$ as shown in the J-V curve.

To better understand the As distribution through the ex-situ AsCl₃ solution-processed doping, the cross-sectional scanning electron microscopy (SEM) and energy-dispersive X-ray spectroscopy (EDS) elemental mapping are carried out as shown in FIG. 4g. The corresponding cross-sectional lines' scan for the distribution of the elements is shown in FIG. 4h. The Se gradient diffused into the CdTe was observed, which contributes to the grading bandgap of the CdSe/CdTe device and increased $J_{SC}$. Interestingly, the As elemental distribution was uniform in the bulk of CdTe and show similar distribution features like the Te elements, indicating that As may occupy the Te sites to form $As_{Te}$ acceptor defects and improve the p-type conduction of CdTe.

Figures 5A, 5B, 5C, 5D, 5E, 5F, 5G, 5H, 5I:
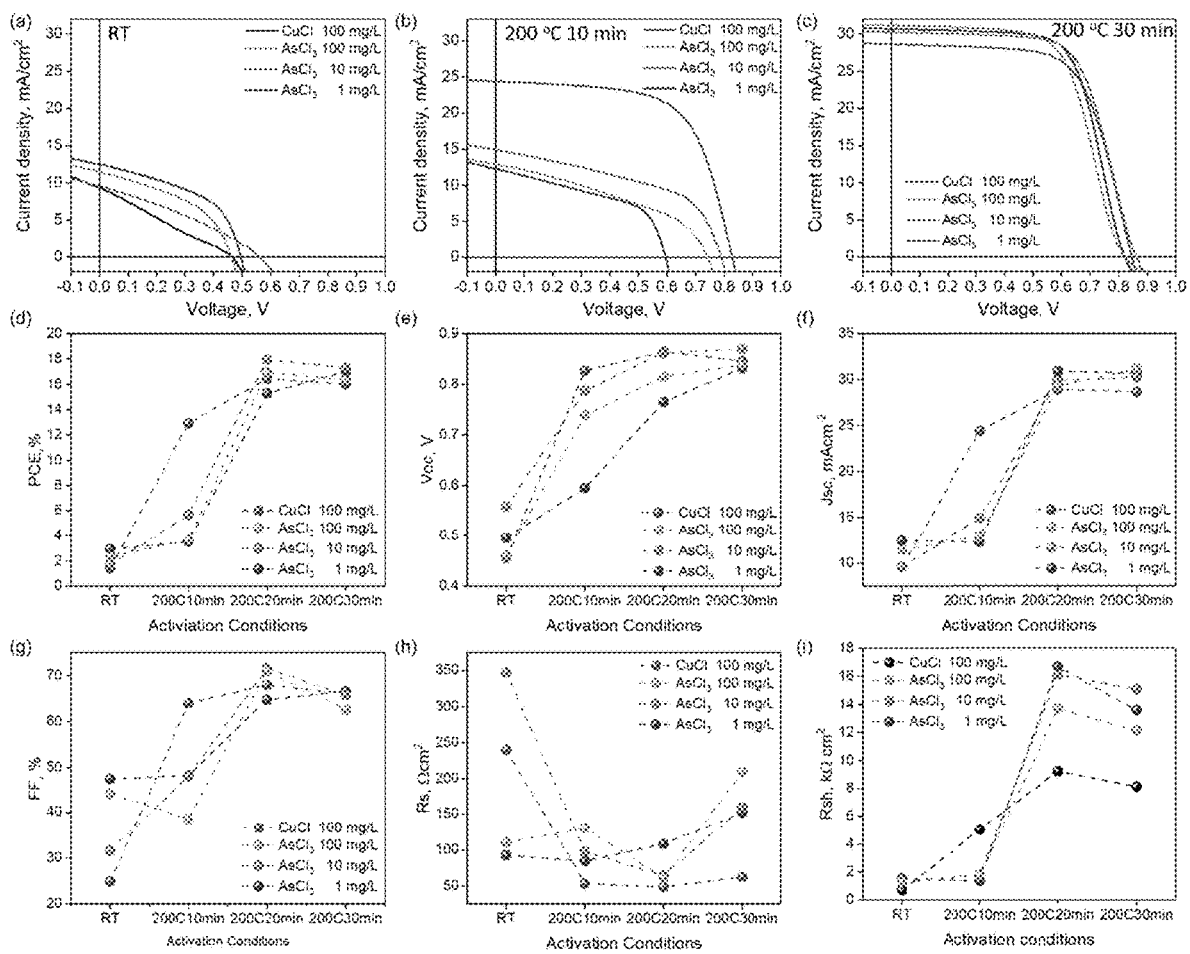
FIGS. 5a-5i: Thermal activation process of ex-situ $AsCl_3$ doping CdTe solar cells.
Figures 6A, 6B, 6C, 6D, 6E, 6F:
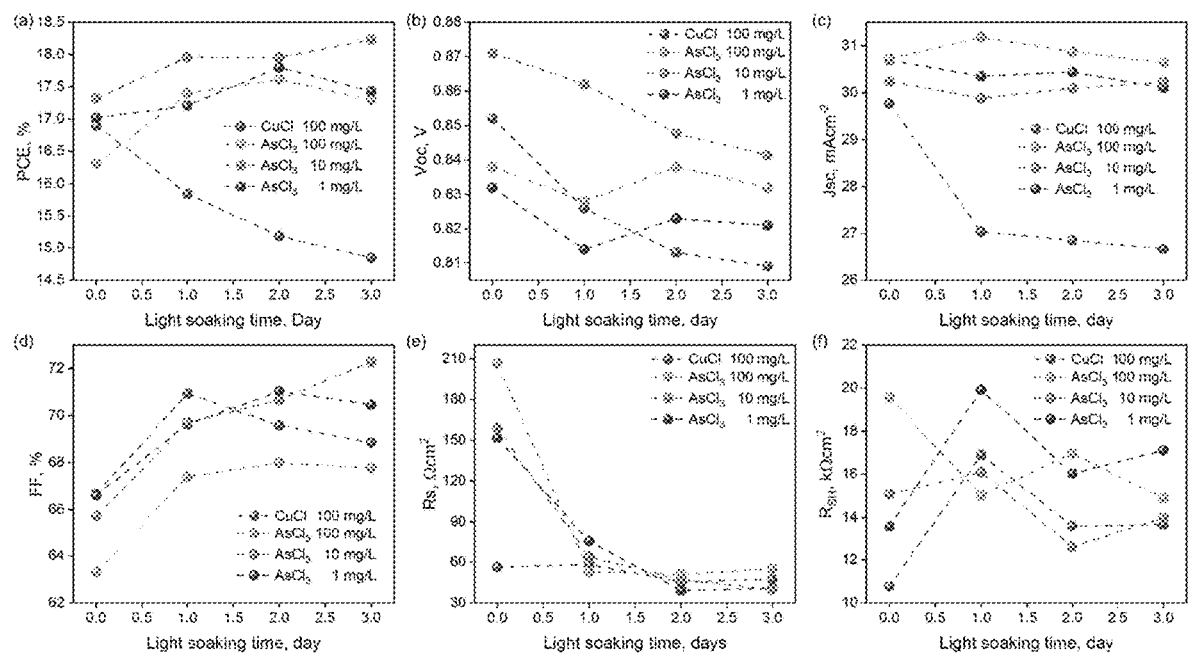
FIGS. 6a-6f: Light soaking effect on the As doped CdTe solar cells at stress time 85° C. and 1 sun.

For the solution-processed CuCl doped CdTe, good ohmic back contact and Cu diffusion are achieved after low-temperature heat treatment (much lower to the CSS deposition and $CdCl_2$ treatment) to form $Cu_{Cd}$ acceptor defects to improve the Cu doped CdTe device performance. It is also critical to converting the inactive As to $As_{Te}$ acceptor defect from the solution-processed ex-situ $AsCl_3$ doped CdTe device through the thermally driven diffusion process, as shown in FIGS. 5a-5i. As activation process by varying the annealing time at a fixed temperature achieves a similar As activation by changing the annealing temperature for a fixed time, such as 200° C. to 240° C. The As activation process as a function of heat treatment time is shown in FIGS. 5a-5c. The as-prepared CdTe devices, e.g., without thermal activation for both CuCl and $AsCl_3$ doping, show low device performance with PCE less than 3% (FIGS. 5a-5d), demonstrating that the $AsCl_3$ and CuCl on the back surface of CdTe are electronically inactive. However, the solution process of the $AsCl_3$ doped CdTe device shows higher device performance (PCE~3%) than that of the CuCl doped ones (PCE 1.5%) without thermal activation. By annealing the doped devices at ambient at 200° C. for 10 min, the CuCl doped CdTe show greater improvement than that of the As doped CdTe (FIG. 5b), in particular for the $V_{oc}$ and FF. This is due to the significant reduction in series resistivity, which indicates a faster ohmic back contact ($Cu_xTe$) formation and Cu diffusion than those of As ions (i.e., $As_xTe$ back contact and As diffusion), which is in agreement with the in-situ As doped CdTe that Cu diffuses faster than As in CdTe (W. K. Metzger et al., *Nature Energy*, 2019; E. Colegrove et al., *Thin Solid Films*, 2002, 403, 216-222). Interestingly, within 10 minutes of heat treatment, the $V_{oc}$ improvement dominated the device performance of $AsCl_3$ doped CdTe while the $J_{sc}$ improvement is limited, indicating that the $As_xTe$ ohmic back contact formation is slower than that of the $Cu_xTe$ back contact and it impacts the carrier collection.

By increasing the annealing time to 20 minutes at 200° C., the champion device for both CuCl and $AsCl_3$ doped CdTe was achieved as shown in Table 1 and FIG. 2a. The 100 mg/L CuCl doped CdTe devices show the best PCE 17.44%, and the 100 mg/L $AsCl_3$ doped CdTe with PCE~17.61%, while 10 mg/L $AsCl_3$ doped CdTe can achieve 18.2%, and the 1 mg/L $AsCl_3$ could only achieve a PCE ~15.1%. However, for the 1 mg/L $AsCl_3$ doped CdTe devices, when further annealed to 30 minutes at 200° C., a better device performance with PCE~17.8% was achieved. This is because the 1 mg/L $AsCl_3$ doped device may not have enough As incorporation and remain underactive in a short time. Note that the cells, i.e., 100 mg/L CuCl and 10, 100 mg/L $AsCl_3$ doped CdTe devices start to degrade due to the over annealing and may drive too much Cu and As to the front end to increase the series resistivity, $R_s$, and reduce the FF and shunting resistivity, $R_{sh}$ as shown in FIGS. 5h-5i. It is also possible that the front $SnO_2$ contact catalyzes oxide layer during the activation heat treatment to increase the $R_s$ while more Cu and As diffuse into the front contact (C. L. Perkins et al., *ACS Appl Mater & Interfaces*, 2019, 11, 13003-13010). Therefore, it further confirms that the 10 mg/L $AsCl_3$ concentration for CdTe doping is desired, while the 100 mg/L $AsCl_3$ may be over doping and 1 mg/L $AsCl_3$ is under doping. Meanwhile, it has also shown a weak roll-over in the J-V curves for the cells annealed at 200° C. for 30 minutes for both CuCl and $AsCl_3$ doped CdTe, especially for the 100 mg/L $AsCl_3$ doped CdTe, which has contributed to the non-ohmic properties of the back contact after a long time annealing in air. This needs further investigation to clarify the root cause for the non-ohmic properties. It could probably be due to the CuO and $As_2O_3$ formation nearby the back contact.

One of the critical drawbacks for the Cu doped CdTe devices is its long-term stability, which has been addressed by replacing Cu with As in the in-situ As doped CdTe devices (W. K. Metzger et al., *Nature Energy*, 2019). To investigate the long-term stability of the ex-situ solution-processed As doped CdTe, an accelerated stability test via a light soaking at 85° C. and 1 sun intensity was performed as shown in FIGS. 6a-6f. The cells for this light soak test had a thermal activation done at 200° C. for 20 minutes and with decent PCE>16% initially. It is obtained that CuCl doped CdTe device undergoes a severe degradation (e.g., PCE, $V_{oc}$, and $J_{sc}$) monotonically during the light soak due to the fast migration of Cu, back-barrier increase, net acceptor concentration decrease, and Cu interstitial formation (J. Burst et al., *APL Mater*, 2016, 4, 116102; M. Nardone and D. S. Albin, *IEEE J Photovoltaics*, 2015, 5, 962-967; C. Gretener et al., *Sol Energy Mater Sol C*, 2016, 146, 51-57). The FF of CuCl doped CdTe increased in the beginning but significantly dropped as more Cu diffused into the front of the CdTe device.

Surprisingly, the $AsCl_3$ doped CdTe showed a slight increase and remained stable for a much longer time during the light soaking (FIGS. 6a-6f). Remarkably, the light soaking could significantly improve the FF (FIG. 6d) and reduce the $R_s$ (FIG. 6e), suggesting that the light soaking of $AsCl_3$ doped CdTe may reduce the back-barrier height. This reduced back-barrier by $AsCl_3$ doping can be associated with the slow diffusion rate of As ions on the CdTe surface by accelerating the $As_xTe$ formation nearby the back contact. In addition, the extra Cl from the $AsCl_3$ may also further passivate the grain boundary of CdTe and could increase the net carrier concentration in the bulk of CdTe. Meanwhile, the $J_{sc}$ for all the $AsCl_3$ doped CdTe remained stable during the light soaking while the $V_{oc}$ drops by a small percentage in 3 days, e.g., 840 mV to 830 mV for 100 mg/L $AsCl_3$ (1.2% drop), 870 mV to 847 mV for 10 mg/L $AsCl_3$ (2.6% drop) and 835 mV to 825 mV for 1 mg/L $AsCl_3$ (1.2% drop), than that of the CuCl doped CdTe~852 mV to 810 mV (~5% $V_{oc}$ drop). This stable device performance of ex-situ $AsCl_3$ doped CdTe is in agreement with that of the in-situ As doped CdTe, where the carrier concentration remained stable in As doped CdTe due to the slow diffusion of As when compared with that of Cu (W. K. Metzger et al., *Nature Energy*, 2019). Further investigation is needed to further stabilize and improve the $V_{oc}$ to achieve higher efficiency without sacrificing the other device parameters, such as $J_{sc}$ and FF.

SUMMARY

In summary, through a solution-processed ex-situ $AsCl_3$ doping in the CSS grown polycrystalline CdSe/CdTe solar cells, the PCE can exceed 18% contributed by the improved carrier concentration and better ohmic contact formation, e.g., one order of magnitude higher than that of CuCl doped counterparts and improved FF. The ex-situ $AsCl_3$ doped CdTe also possess greatly improved stability compared to that of the Cu doped CdTe devices. The promising PCE and stability using the ex-situ $AsCl_3$ solution for the CdTe after the $CdCl_2$ treatment create a more suitable way to integrate the benefits of As doping of CdTe to the module manufacturing. The ex-situ As doping in CdTe through $AsCl_3$ solution will not disturb the conventional CdTe deposition and $CdCl_2$ thermal treatment and can minimize the As risk and footprints during the production process. Further improvement is expected by fine-tuning the $AsCl_3$ solution concentration and thermal activation post $AsCl_3$ deposition. This solution-processed ex-situ As doping creates a suitable way to introduce As dopants into the CdTe manufacturing process via a low-cost strategy to address the stability issue in Cu doped CdTe devices. Overall, by further boosting the As doped CdTe solar cell device performance with improved PCE and stability, more affordable solar energy could be achieved.

What is claimed is:

1. A method of ex-situ doping cadmium telluride (CdTe) with P, As, Sb, or Bi, comprising:
   a) depositing a cadmium telluride (CdTe) film onto a substrate;
   b) heat-treating the cadmium telluride film with cadmium chloride ($CdCl_2$); and then
   c) contacting the heat-treated cadmium telluride film with a solution or vapor comprising P halide, As halide, Sb halide, or Bi halide, to thereby provide a cadmium telluride film doped with P, As, Sb, or Bi.

2. The method of claim 1, wherein the substrate further comprises a cadmium selenide, cadmium sulfide, or ZnMgO buffer layer.

3. The method of claim 1, wherein the cadmium telluride film is polycrystalline.

4. The method of claim 1, wherein depositing the cadmium telluride film onto the substrate is performed in the absence of P, As, Sb, or Bi.

5. The method of claim 1, wherein depositing the cadmium telluride film is by closed space sublimation, vapor transport deposition, metal-organic chemical vapor deposition, electrodeposition, elemental vapor transport, or molecular beam epitaxy.

6. The method of claim 1, wherein the substrate is a transparent conducting oxide (TCO) selected from indium doped tin oxide (ITO), fluorine-doped tin oxide (FTO), aluminum-doped ZnO (AZO), or a combination thereof.

7. The method of claim 1, wherein contacting the heat-treated cadmium telluride film with the solution or vapor is by spin coating, dip coating, slot die, or spraying the solution or vapor onto the cadmium telluride film.

8. The method of claim 1, wherein contacting the heat-treated cadmium telluride film with the solution or vapor is done under a dry inert gas.

9. The method of claim 1, wherein the solution or vapor comprises from about 1 to about 1,000 mg/L of the P halide, As halide, Sb halide, or Bi halide.

10. The method of claim 1, wherein the solution or vapor comprises about 10 mg/L of the P halide, As halide, Sb halide, or Bi halide.

11. The method of claim 1, wherein after the heat-treated cadmium telluride film is coated with the solution or vapor, the film is further contacted with graphite or a metal contact.

12. The method of claim 1, wherein after the heat-treated cadmium telluride film is coated with the solution or vapor the film is further heated to activate the P, As, Sb, or Bi, dopants in the film.

13. The method of claim 1, wherein the P halide, As halide, Sb halide, or Bi halide is $AsCl_3$, $PCl_3$, $SbCl_3$, or $BiCl_3$.

14. The method of claim 1, wherein the heat-treated cadmium telluride film is contacted with a solution or vapor of $AsCl_3$.

15. The method of claim 1, wherein the solution further comprises methanol, ethanol, propanol, isopropanol, butanol, pentanol, benzene, carbon sulfide, or a combination thereof.

16. The method claim 1, wherein heat-treating the films is performed at a temperature from about 200° C. to about 600° C.

17. The method of claim 1, wherein after the cadmium telluride film is heat treated, but before it is contacted with the solution or vapor, the cadmium telluride film is cleaned.

18. The method claim 1, wherein contacting the heat-treated cadmium telluride film with a solution or vapor is done at a temperature of less than about 400° C.

* * * * *

UNITED STATES PATENT AND TRADEMARK OFFICE
CERTIFICATE OF CORRECTION

| | |
|---|---|
| PATENT NO. | : 11,257,977 B2 |
| APPLICATION NO. | : 17/190664 |
| DATED | : February 22, 2022 |
| INVENTOR(S) | : Feng Yan |

It is certified that error appears in the above-identified patent and that said Letters Patent is hereby corrected as shown below:

In the Specification

In Column 1, Line 11, before the "BACKGROUND" section, please insert the following new paragraph:
--STATEMENT OF GOVERNMENT SUPPORT
This invention was made with government support under Grant No. DE-EE0009368 awarded by the Department of Energy. The U.S. government has certain rights in the invention.--

Signed and Sealed this
Seventeenth Day of January, 2023

Katherine Kelly Vidal
*Director of the United States Patent and Trademark Office*